US012106812B2

(12) United States Patent
Lien et al.

(10) Patent No.: US 12,106,812 B2
(45) Date of Patent: Oct. 1, 2024

(54) DETECTING A MEMORY WRITE RELIABILITY RISK WITHOUT USING A WRITE VERIFY OPERATION

(71) Applicant: Micron Technology, Inc., Boise, ID (US)

(72) Inventors: Yu-Chung Lien, San Jose, CA (US); Zhenming Zhou, San Jose, CA (US); Tomer Tzvi Eliash, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 17/819,826

(22) Filed: Aug. 15, 2022

(65) Prior Publication Data
US 2024/0055060 A1   Feb. 15, 2024

(51) Int. Cl.
| G11C 11/34 | (2006.01) |
| G11C 16/10 | (2006.01) |
| G11C 16/24 | (2006.01) |
| G11C 16/32 | (2006.01) |
| G11C 16/34 | (2006.01) |

(52) U.S. Cl.
CPC ........ *G11C 16/3459* (2013.01); *G11C 16/102* (2013.01); *G11C 16/24* (2013.01); *G11C 16/32* (2013.01)

(58) Field of Classification Search
USPC ........................................ 365/185.22, 185.19
See application file for complete search history.

(56) References Cited

U.S. PATENT DOCUMENTS

| 2015/0043275 A1* | 2/2015 | Srinivasan ......... G11C 16/3418 |
| | | 365/185.03 |
| 2019/0035468 A1* | 1/2019 | In ........................... G11C 16/08 |

* cited by examiner

*Primary Examiner* — Son T Dinh
(74) *Attorney, Agent, or Firm* — Harrity & Harrity, LLP

(57) ABSTRACT

Implementations described herein relate to detecting a memory write reliability risk without using a write verify operation. In some implementations, a memory device may perform a program operation that includes a single program pulse and that does not include a program verify operation immediately after the single program pulse. The memory device may set a flag value based on comparing a transition time and a transition time threshold. The transition time may be a time to transition from a first voltage to a second voltage during the program operation. The memory device may selectively perform a mitigation operation based on whether the flag value is set to a first value or a second value.

25 Claims, 12 Drawing Sheets

DETECTING A MEMORY WRITE RELIABILITY RISK WITHOUT USING A WRITE VERIFY OPERATION

TECHNICAL FIELD

The present disclosure generally relates to memory devices, memory device operations, and, for example, to detecting a memory write reliability risk without using a write verify operation.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
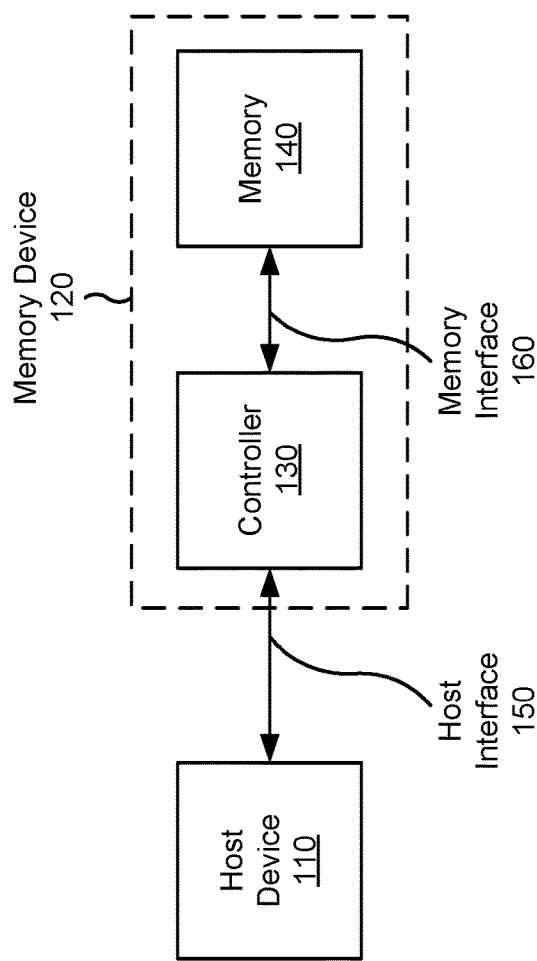
FIG. 1 is a diagram illustrating an example system capable of detecting a memory write reliability risk without using a write verify operation.

When a memory device performs a write operation (sometimes called a program operation) to write (or program) data to memory, the memory device may apply one or more program pulses to apply a voltage to memory cells to cause those cells to store a desired data state (e.g., a "0" or a "1"). After applying a program pulse, the memory device may perform a program verify operation to verify that the desired data state is stored by the memory cells. If the desired data state is stored (e.g., by a threshold quantity or percentage of memory cells), then the write operation passes. If the desired data state is not stored (e.g., by a threshold quantity or percentage of memory cells), then the memory device can perform a corrective action, such as by applying one or more additional program pulses, preventing further use of the memory cells and/or a block that includes the memory cells, or the like.

Performing a program verify operation increases the reliability of the memory device by ensuring that the write operation was successfully performed to program memory cells to a desired state. However, performing a program verify operation requires power and time. Thus, a write operation that includes a program verify operation consumes more power (e.g., results in greater peak current and/or greater average current) and has a longer write time (sometimes called a program time) than a write operation that does not include a program verify operation. Thus, a memory device can reduce power consumption and increase performance (e.g., via faster write times) by using a write operation that does not include a program verify operation. However, this leads to reliability risks because the memory device will be unable to determine whether write operations are successful. For example, skipping or refraining from performing a program verify operation may lead to incorrect data being stored by the memory device, especially as the memory device ages and memory cells (and other memory components, such as access lines and bit lines) degrade.

Some implementations described herein enable a memory device to operate with reduced power consumption and faster write times by disabling (e.g., refraining from performing) a program verify operation by default, while also enabling high reliability by using another mechanism to detect potential reliability issues. For example, some implementations described herein enable the memory device to monitor a ramping time to ramp from a first voltage (e.g., a baseline voltage) to a second voltage (e.g., a program voltage or an inhibit voltage) when performing a write operation. If the ramping time is less than (or equal to) a threshold, then the memory device may determine that a reliability risk is low, and may perform the write operation without using a program verify operation, thereby reducing power consumption and reducing a write time (e.g., as compared to always performing the program verify operation as part of the write operation). If the ramping time is greater than (or equal to) the threshold, then this may be indicative of a reliability risk (e.g., due to access line shorting or bit line shorting), which may trigger the memory device to perform a verification operation, such as a program verify operation. Thus, overall power consumption and write times can be reduced for the memory device while still maintaining reliable data storage.

FIG. 1 is a diagram illustrating an example system 100 capable of detecting a memory write reliability risk without using a write verify operation. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMNIC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to determine a ramping time to ramp from a first voltage to a second voltage during a program operation to program data to the memory device, wherein the program operation includes a program pulse that is not immediately followed by a program verify operation; determine that the ramping time is greater than or equal to a ramping time threshold; and perform a verification operation based on determining that the ramping time is greater than or equal to the ramping time threshold.

In some implementations, the memory device 120 and/or the controller 130 may be configured to determine a transition time to transition from a first voltage to a second voltage during a program operation performed by the memory device and/or the controller to program data to memory, wherein the program operation includes a program pulse and only includes a program verify operation if the transition time satisfies the transition time threshold; compare the transition time to a transition time threshold; set a flag value based on comparing the transition time and the transition time threshold; and selectively perform one or more mitigation operations based on the flag value.

In some implementations, the memory device 120 and/or the controller 130 may be configured to perform a program operation that includes a single program pulse and that does not include a program verify operation immediately after the single program pulse; set a flag value based on comparing a transition time and a transition time threshold, wherein the transition time is a time to transition from a first voltage to a second voltage during the program operation; and selectively perform a mitigation operation based on whether the flag value is set to a first value or a second value.

As indicated above, FIG. 1 is provided as an example. Other examples may differ from what is described with regard to FIG. 1.

Figure 2:
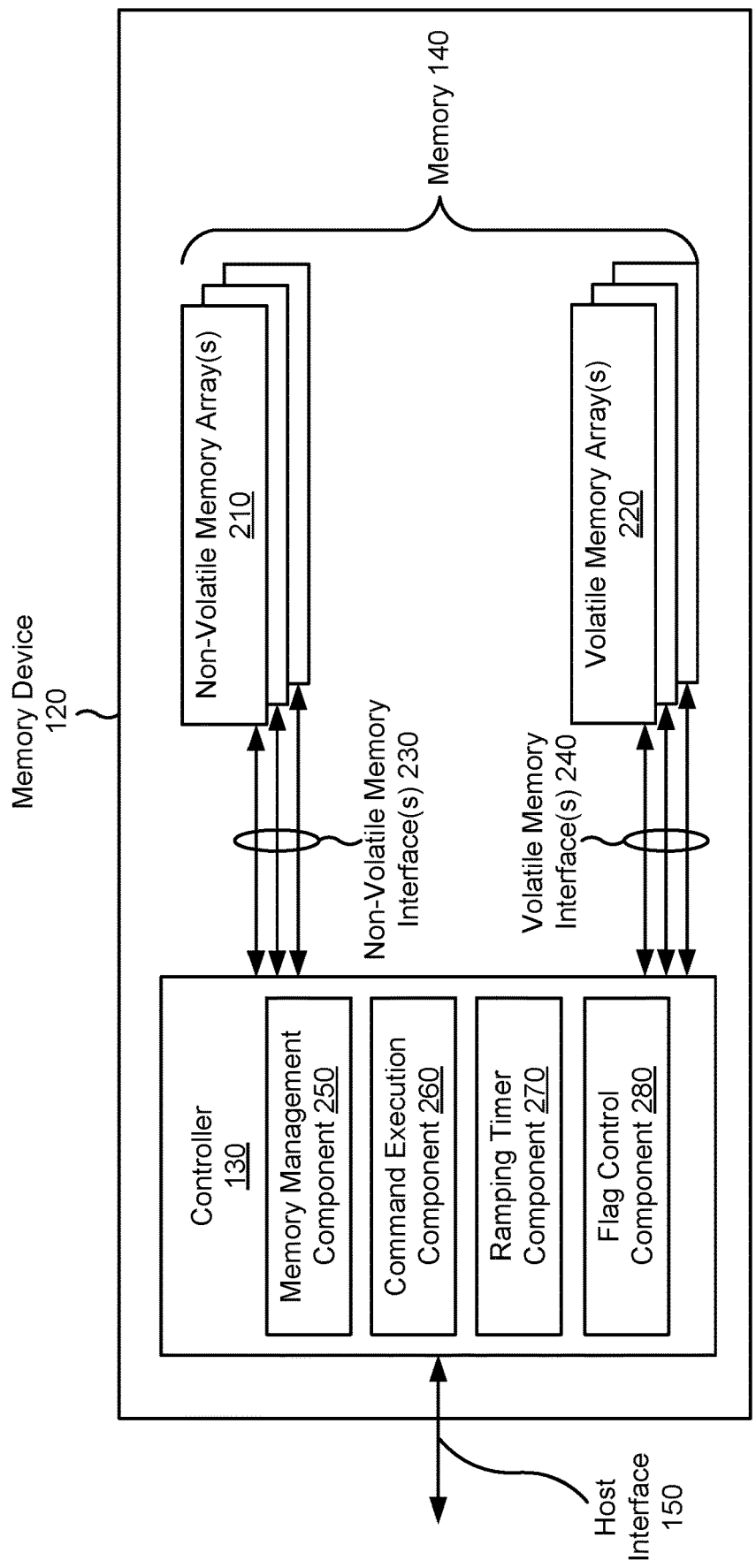
FIGS. 2-3 are diagrams of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, a command execution component 260, a ramping timer component 270, and/or a flag control component 280. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The command execution component 260 may be configured to execute one or more memory commands, such as a write command (sometimes called a program command). For example, the command execution component 260 may be configured to apply one or more program pulses to write data to memory cells. In some implementations, the command execution component 260 is configured to perform the write operation without performing a program verify operation immediately after applying a program pulse. However, in some implementations, the command execution component 260 may perform a program verify operation (e.g., at a later time not immediately after applying the program pulse) after determining that a condition is detected that is indicative of a reliability risk of the memory device (e.g., a ramping time being greater than or equal to a threshold).

The ramping timer component 270 may be configured to determine a ramping time (sometimes called a transition time) to ramp (or transition) from a first voltage to a second voltage. In some implementations, the ramping timer component 270 may be configured to determine the ramping time during a program operation, such as while the command execution component 260 is executing a program command. The ramping timer component 270 may be configured to compare the ramping time to a threshold. In some implementations, the ramping timer component 270 may transmit a notification to the command execution component 260 based on whether the ramping time satisfies the threshold. For example, the ramping timer component 270 may instruct the command execution component 260 to perform a program verify operation if the ramping time satisfies the threshold. Additionally, or alternatively, the ramping timer component 270 may instruct the command execution component 260 to refrain from performing the program verify operation if the ramping time does not satisfy the threshold. Additionally, or alternatively, the ramping timer component 270 may be configured to indicate, to the flag control component 280, whether the ramping time satisfies the threshold. In some implementations, the ramping timer component 270 may use a timer to determine the ramping time.

The flag control component 280 may be configured to set a value of a flag based on whether the ramping time satisfies the threshold. For example, the flag control component 280 may be configured to set the flag value to a first value (e.g., "0") based on the ramping time being less than (or equal to) the threshold. Additionally, or alternatively, the flag control component 280 may be configured to set the flag value to a second value (e.g., "1") based on the ramping time being greater than (or equal to) the threshold. In some implementations, the command execution component 260 may selectively perform (e.g., perform or refrain from performing) a program verify operation based on the value of the flag. For example, the command execution component 260 may refrain from performing the program verify operation if the flag value is set to the first value, and the command execution component 260 may perform a verification operation, such as a program verify operation, if the flag value is set to the second value.

Figure 7:
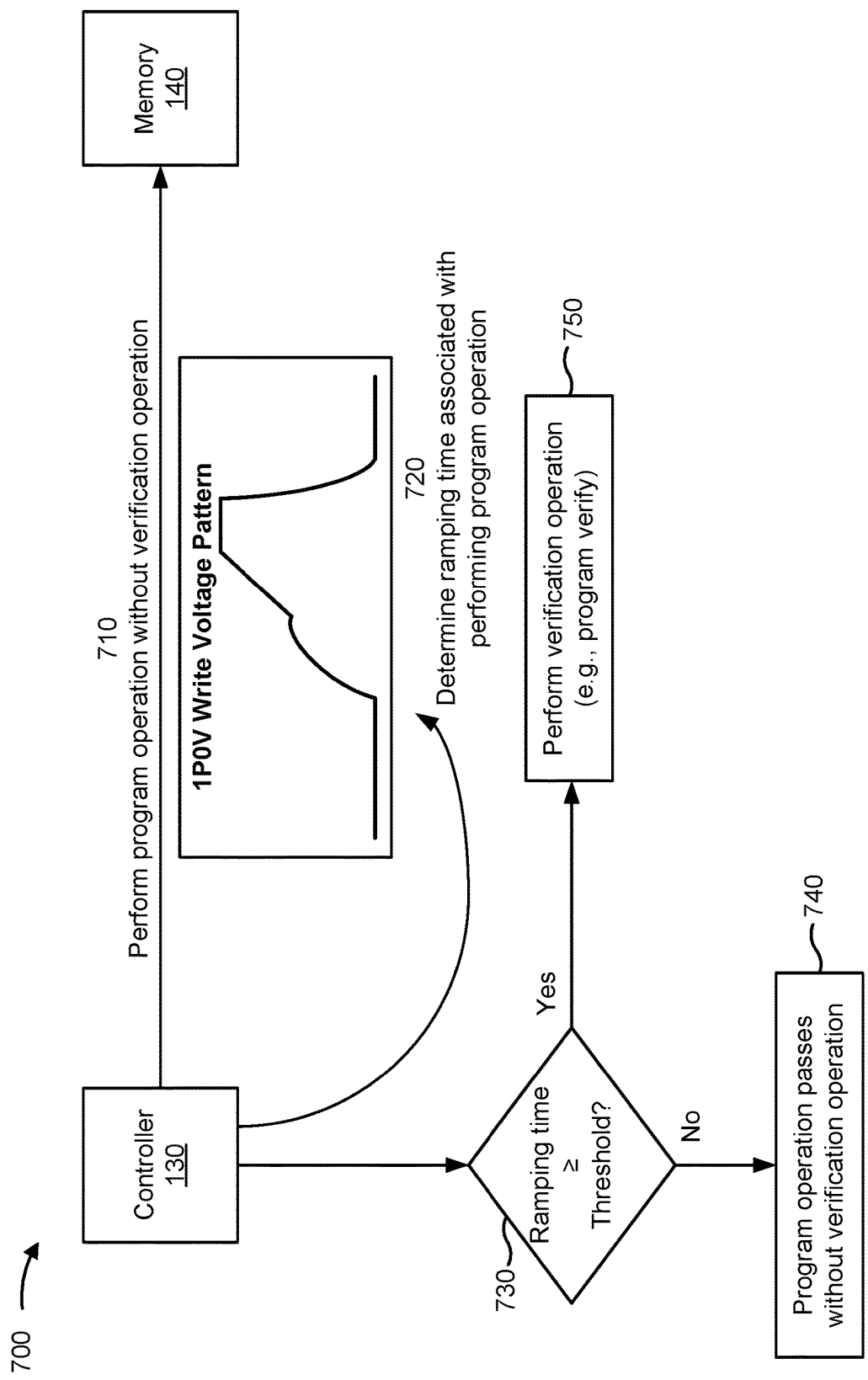
FIGS. 7-8 are diagrams of examples of detecting a memory write reliability risk without using a write verify operation.
Figure 8:
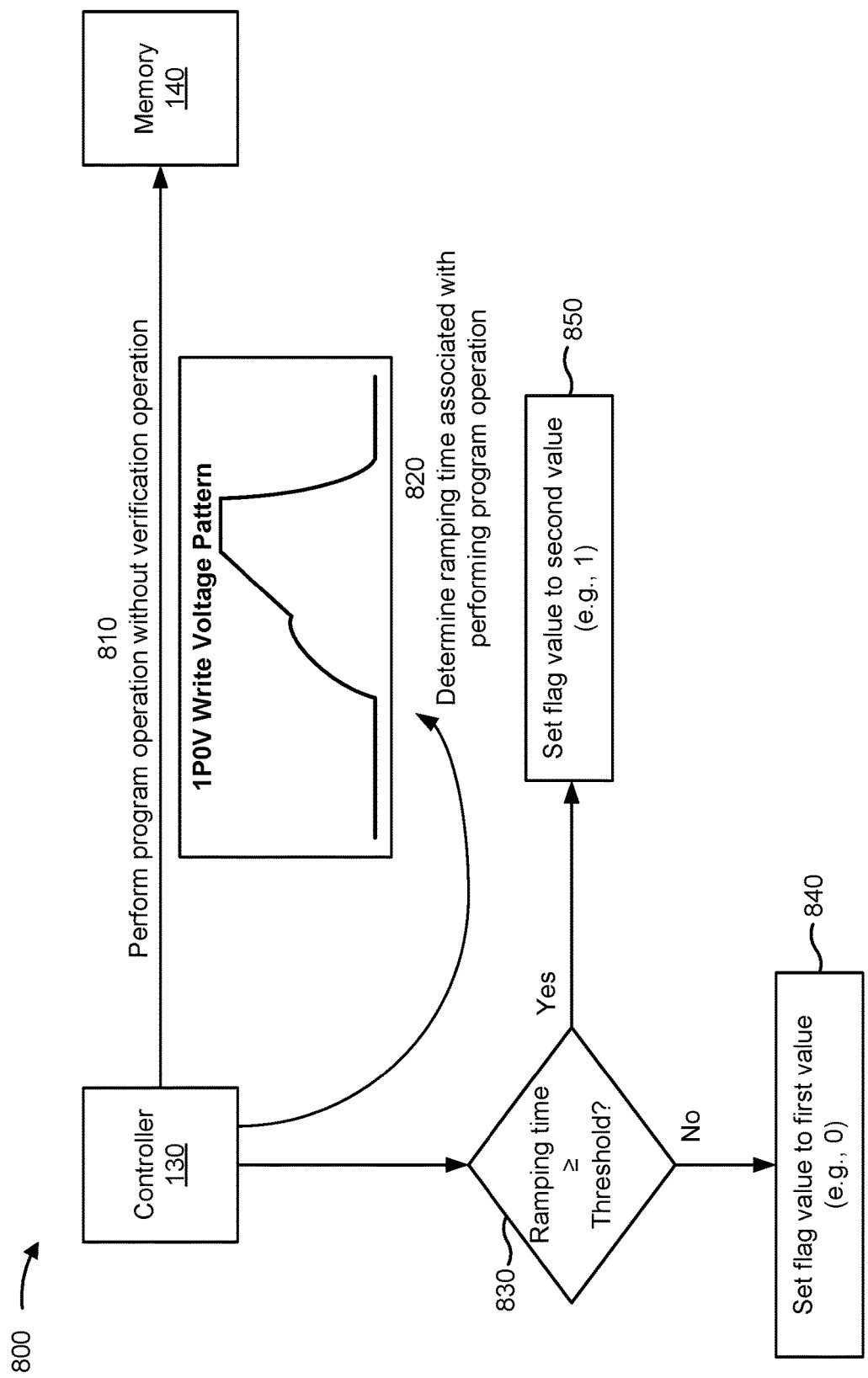
Figure 9:
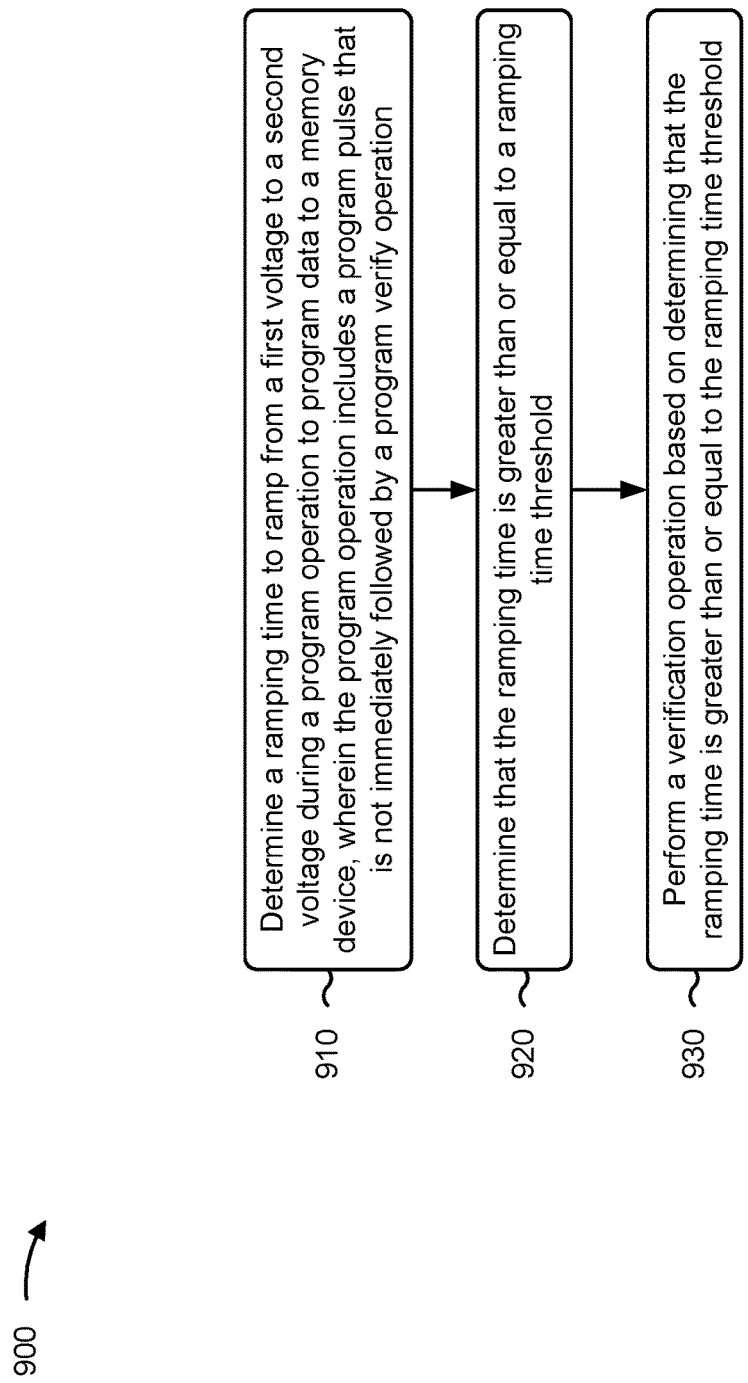
FIGS. 9-11 are flowcharts of example methods associated with detecting a memory write reliability risk without using a write verify operation.
Figure 10:
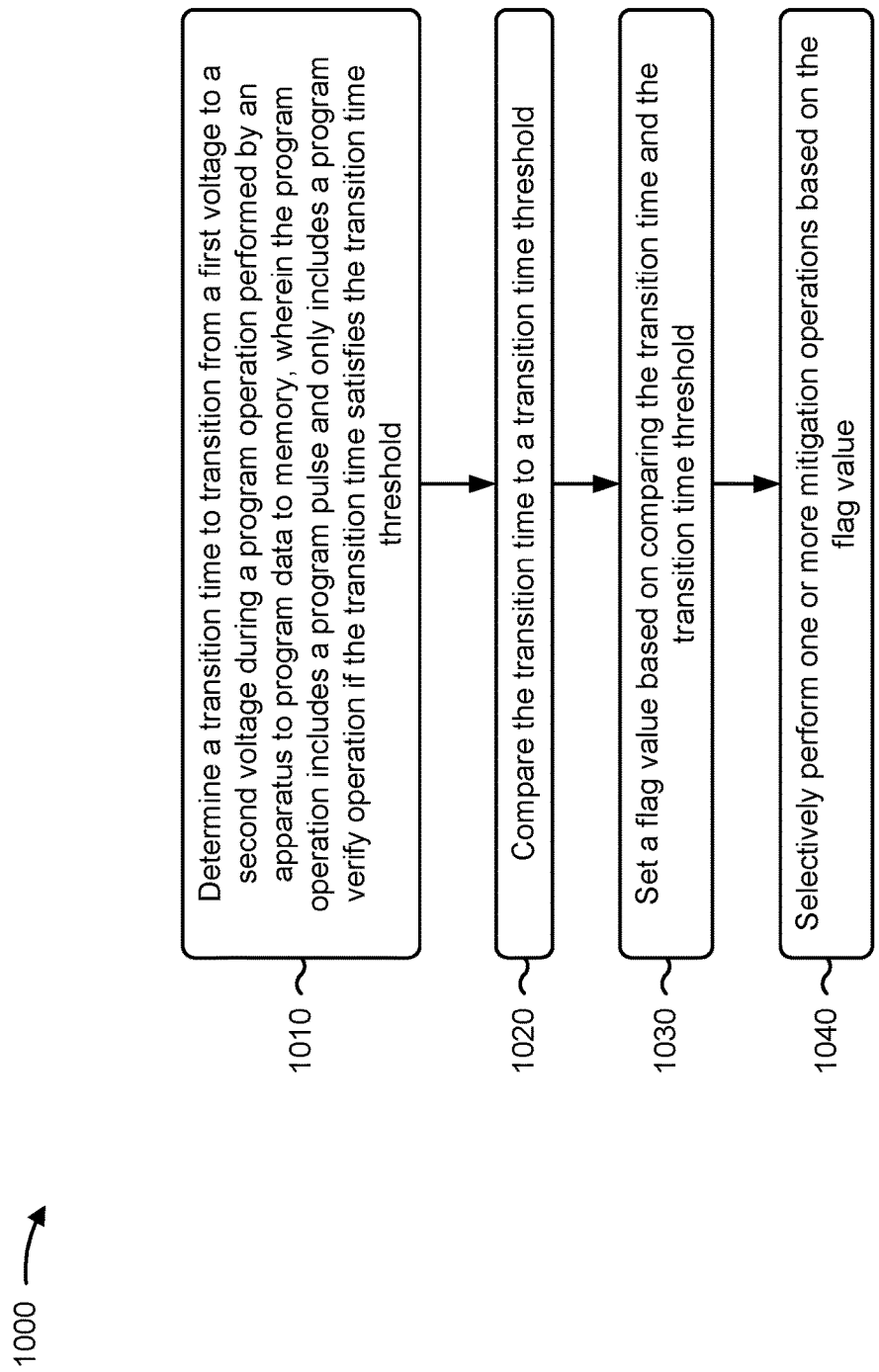
Figure 11:
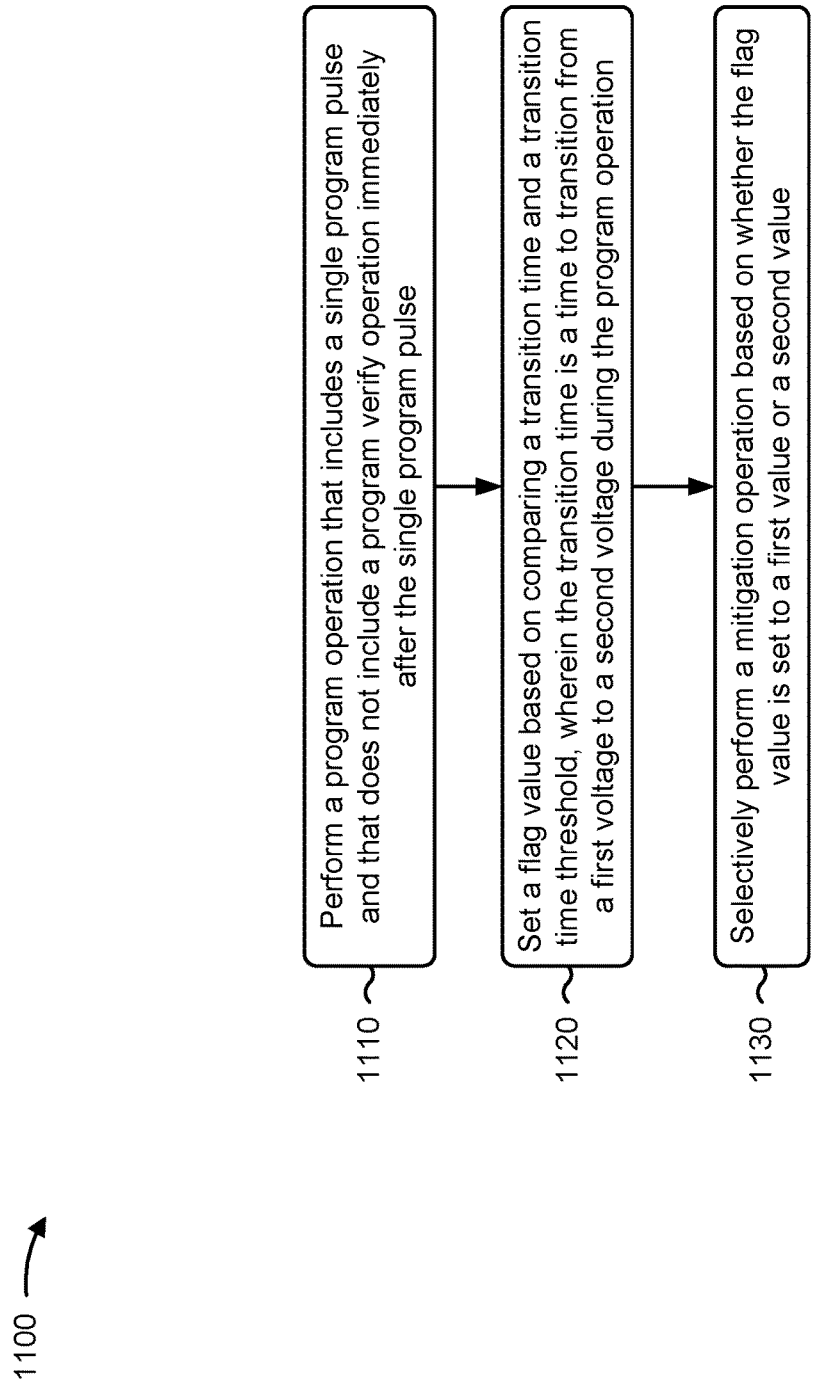

One or more devices or components shown in FIG. 2 may be configured to perform operations described elsewhere herein, such as one or more operations of FIGS. 3-8 and/or one or more process blocks of the methods of FIGS. 9-11. For example, the controller 130, the memory management component 250, the command execution component 260, the ramping timer component 270, and/or the flag control component 280 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
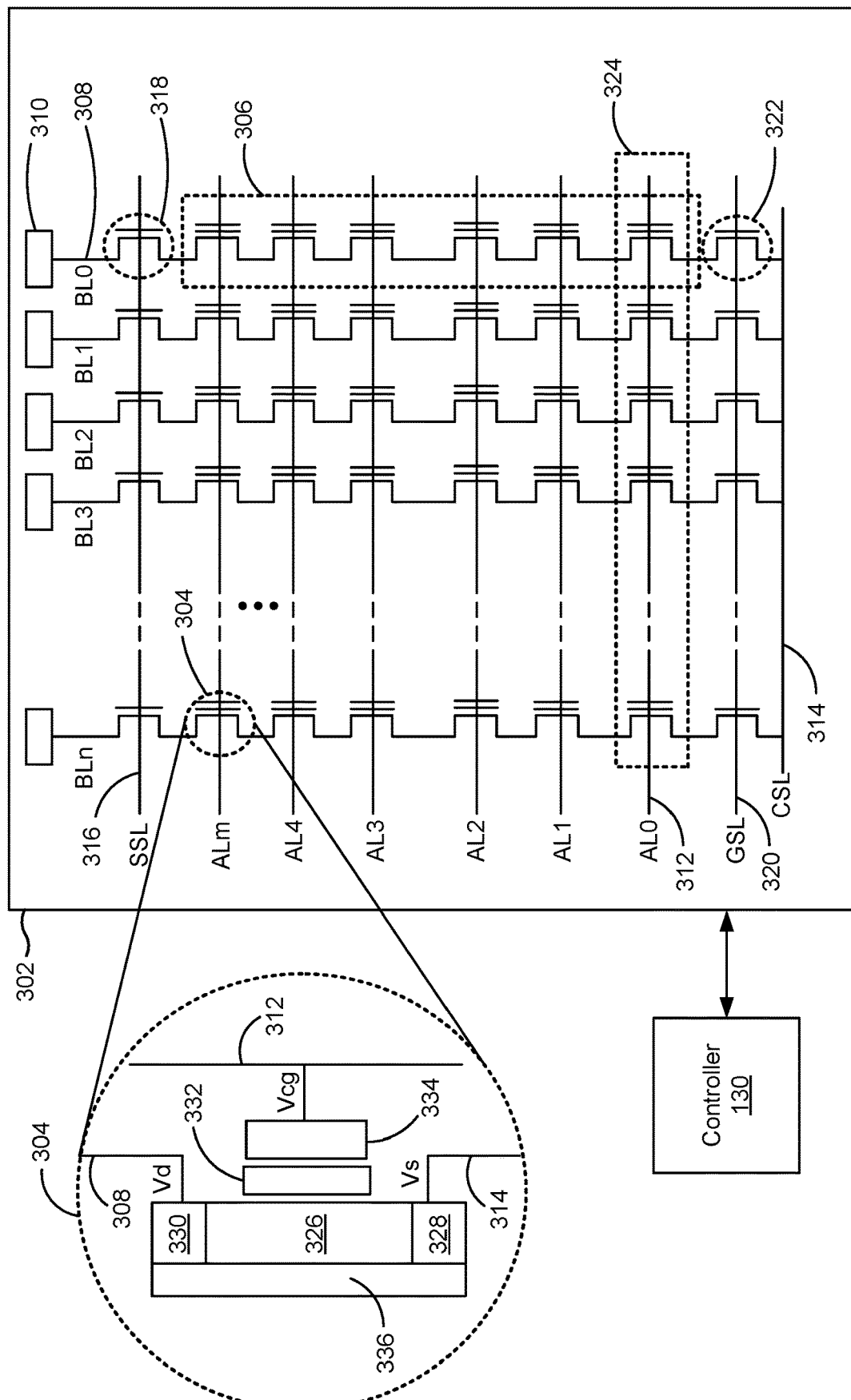

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 210 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn). Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via access lines 312 (sometimes called word lines or row lines, and shown as AL0-ALm) that select which row (or rows) of memory cells 304 is affected by a memory operation (e.g., a read operation or a write operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same access line 312, as shown by reference number 324. In some implementations (e.g., for single-level cells), the memory cells 304 connected to an access line 312 may be associated with a single page of memory. In some implementations (e.g., for multi-level cells), the memory cells 304 connected to an access line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding access line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage Vd may be supplied from a bit line 308, a control gate voltage Vcg may be supplied from an access line 312, and a source voltage Vs may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding access line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used.

To read the memory cell 304, a read voltage may be applied to the control gate 334 (e.g., via a corresponding access line 312), and an I/O component 310 (e.g., a sense amplifier) may determine the data state of the memory cell 304 based on whether current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each access line 312 other than the access line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level cell (SLC) that stores one of two data states, the data state is a "1" if current is detected, and the data state is a "0" if current is not detected. In a multi-level cell (MLC) that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding access line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1").

As indicated above, FIG. 3 is provided as an example. Other examples may differ from what is described with regard to FIG. 3.

Figure 4:
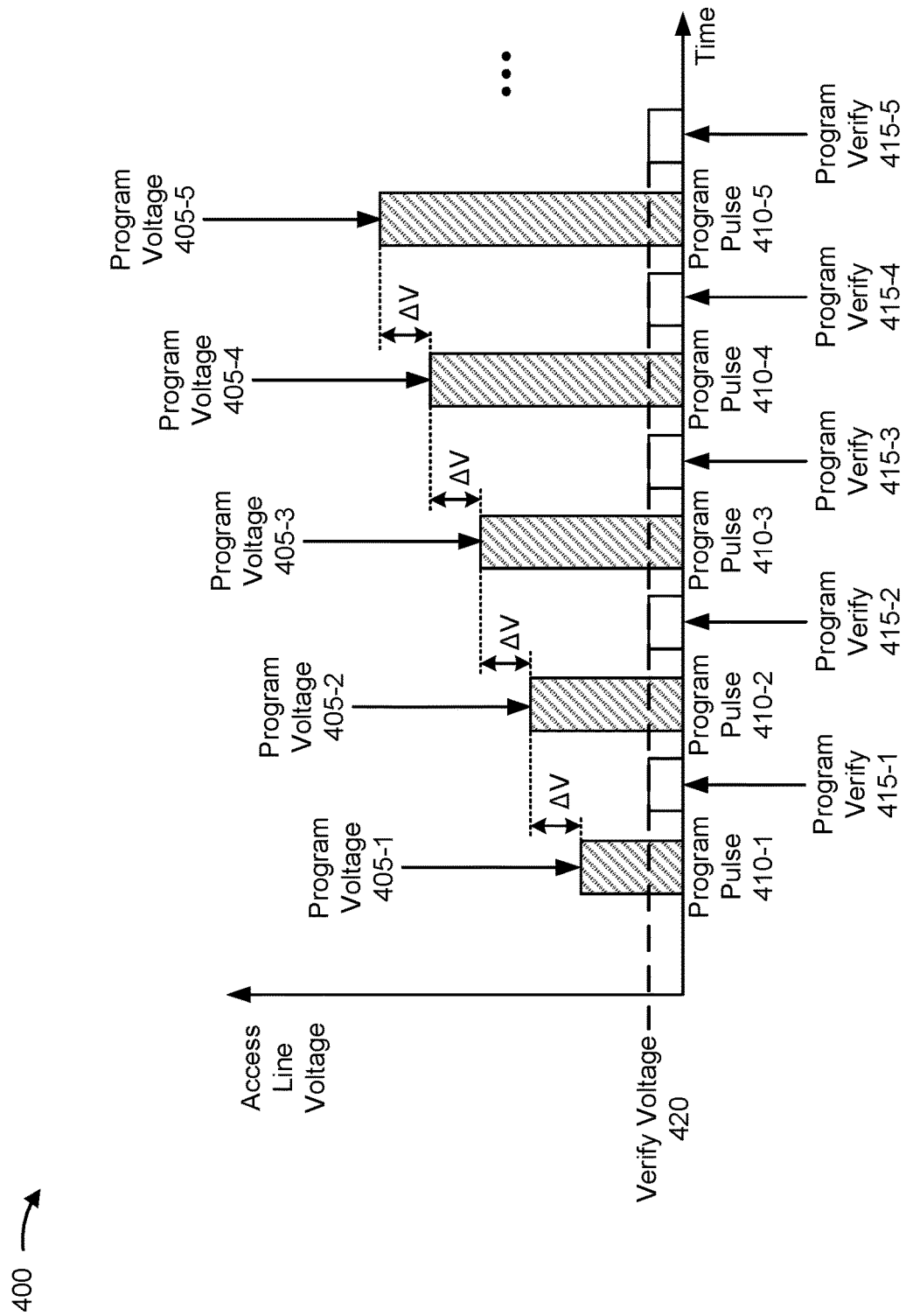
FIG. 4 is a diagram of an example of an incremental step pulse programming operation.

FIG. 4 is a diagram of an example 400 of an incremental step pulse programming (ISPP) operation. An ISPP operation may be used to program (i.e., write to) memory cells. In an ISPP operation, multiple program voltages 405 (sometimes called write voltages) are iteratively applied to a selected access line associated with a page to be programmed. The program voltages 405 increase in magnitude over time (shown as an increase of ΔV), such that an increasing voltage differential is applied to control gates of memory cells to be programmed. Each application of a program voltage 405 may be called a program pulse 410.

For example, a first program voltage 405-1 of a first program pulse 410-1 of an ISPP operation may be the lowest program voltage applied during the ISPP operation. A second program voltage 405-2 of a second program pulse 410-2 of the ISPP operation may be greater than the first program voltage 405-1 (e.g., by a pulse step voltage, shown as ΔV), a third program voltage 405-3 of a third program pulse 410-3 of the ISPP operation may be greater than the second program voltage 405-2 (e.g., by ΔV), and so on. Although the pulse step voltages are shown as being uniform between consecutive pulses, in some implementations, a non-uniform pulse step may be used.

In the ISPP operation, a program verify operation 415 (sometimes called a write verify operation) may be performed after each program pulse 410. The program verify operation 415 includes applying a verify voltage 420 to the selected access line to read the memory cells on the selected access line and determine whether those memory cells have been programmed (e.g., whether a program pulse 410 preceding the program verify operation 415 successfully programmed the memory cells). The program verify operation 415 may be used to differentiate between a set of "pass" memory cells that have been programmed to a desired state and a set of "fail" memory cells that have not been programmed to the desired state based on whether the memory cells conduct when the verify voltage 420 is applied. For example, the verify voltage 420 may be a read voltage corresponding to the desired state.

In some implementations, after a memory cell is identified as a pass memory cell that stores a desired state, that memory cell may be inhibited from further programming by subsequent program pulses 410 (e.g., program pulses 410, of the ISPP operation, that occur after the program verify operation 415 that verified the pass memory cell). For example, the memory device may apply an inhibit voltage (e.g., a positive voltage) to the bit line of the pass memory cell so that a program voltage 405 applied to the control gate of the pass memory cell does not create sufficient voltage differential to draw additional electrons into the floating gate. As an example, if a memory cell is identified as a pass memory cell based on performing the illustrated program verify operation 415-3, then that memory cell may be inhibited from programming during the program pulses 410-4 and 410-5. By inhibiting pass memory cells from further programming, the desired state can be locked into a pass memory cell and the endurance (e.g., a lifespan) of the pass memory cell may be extended by preventing incrementally greater program voltages 405 from degrading the pass memory cell.

The ISPP operation may continue until a condition is satisfied, such as all of the selected memory cells being programmed in the desired state, a threshold quantity or percentage of memory cells being programmed in the desired state, a threshold quantity of program pulses 410 being applied, or a threshold program voltage 405 being reached. Although the ISPP operation shown in FIG. 4 includes five program pulses 410 and five program verify operations 415, the ISPP operation may include a different quantity of program pulses 410 and/or program verify operations 415 in some implementations.

As indicated above, FIG. 4 is provided as an example. Other examples may differ from what is described with regard to FIG. 4.

Figure 5:
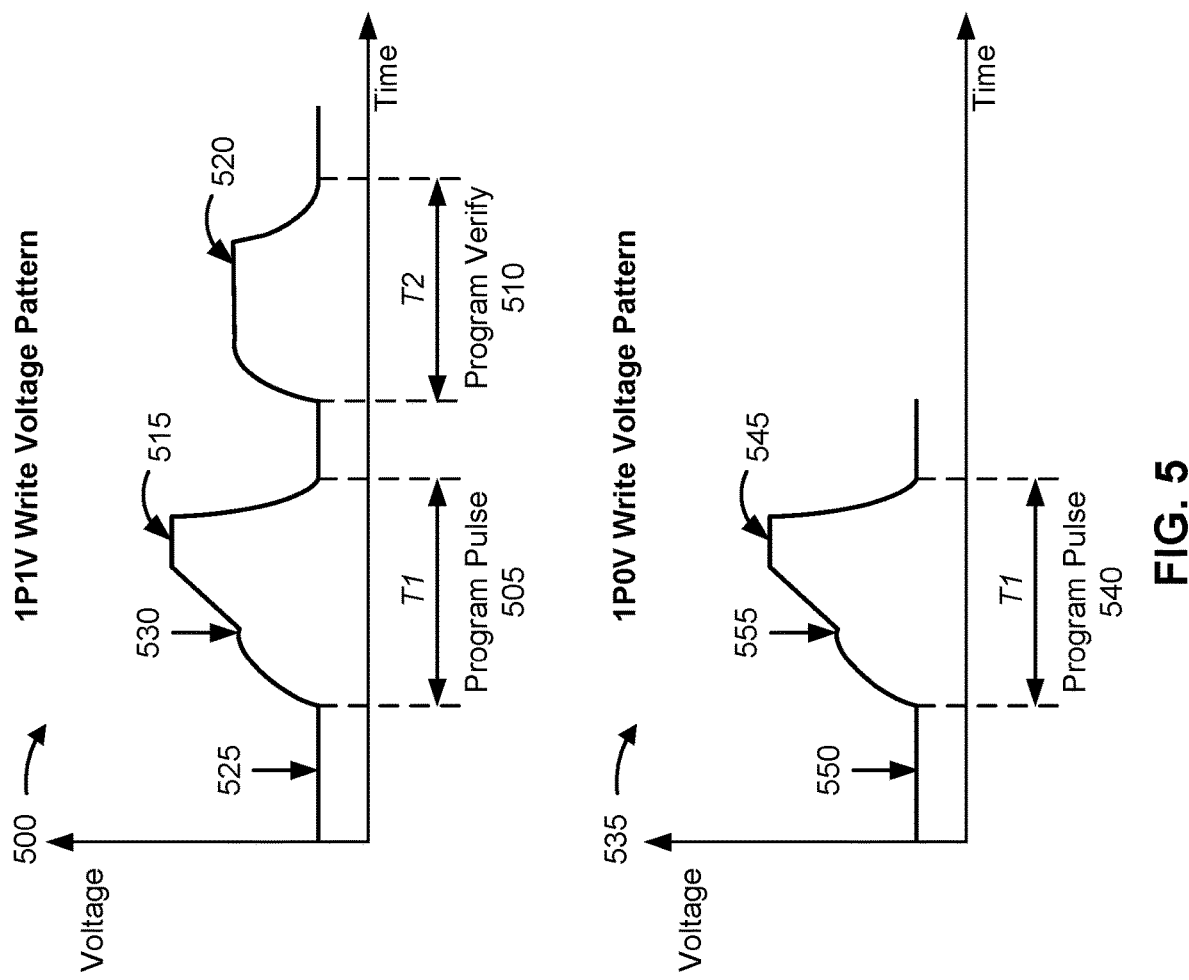
FIG. 5 is a diagram of example write voltage patterns that may be used in connection with some implementations described herein.

FIG. 5 is a diagram of example write voltage patterns (sometimes called program voltage patterns) that may be used in connection with some implementations described herein. FIG. 5 shows an example one-pulse, one-verify (1P1V) write voltage pattern and an example one-pulse, zero-verify (1P0V) write voltage pattern. The 1P1V write voltage pattern and the 1P0V write voltage pattern may be applied to a single sub-block of memory to program the memory cells included in that sub-block. A "sub-block" is a portion of a memory block. For example, a sub-block may include a subset of NAND strings and/or memory cells included in a block, and each sub-block may be mutually exclusive from every other sub-block (e.g., may not include any of the same NAND strings and/or memory cells). A bit line may be shared by multiple sub-blocks.

As shown in FIG. 5, and by reference number 500, a 1P1V write voltage pattern includes a single program pulse 505 that is followed by a program verify operation 510. The program pulse 505 is associated with a program voltage 515, and the program verify operation 510 is associated with a verify voltage 520.

As further shown in FIG. 5, when a memory device 120 performs a 1P1V write operation using a 1P1V write voltage pattern, the memory device 120 raises the voltage on a selected access line from a baseline voltage 525 to the program voltage 515 during a first time period T1 that corresponds to the program pulse 505. The program voltage 515 programs memory cells on the selected access line to a desired state. In some cases, applying the program voltage 515 to the selected access line programs a first set of memory cells (sometimes called pass memory cells) on the selected access line to the desired state and fails to program a second set of memory cells (sometimes called fail memory cells) on the selected access line to the desired state. After applying the program voltage 515, the memory device 120 may reduce the voltage on the selected access line to the baseline voltage 525.

The memory device 120 may then raise the voltage on the selected access line from the baseline voltage 525 to the verify voltage 520 during a second time period T2 that corresponds to the program verify operation 510. After raising the voltage to the verify voltage 520, the memory device 120 may perform a sensing operation (e.g., a read operation) to detect whether the verify voltage 520 applied to a memory cell causes that memory cell to conduct (e.g., whether current flows through the memory cell when the verify voltage 520 is applied). Based on a desired state of the memory cell and based on whether the memory cell conducts when the verify voltage 520 is applied, the memory device 120 may identify the memory cell as a pass memory cell that stores the desired state or a fail memory cell that does not store the desired state. For example, in a single-level memory cell that stores one of two data states, the memory device 120 may apply a verify voltage 520 that is between a first threshold voltage corresponding to a first data state (e.g., 1) and a second threshold voltage corresponding to a second data state (e.g., 0). In this example, the memory cell stores the first data state (e.g., 1) if current is detected, and the memory cell stores the second data state (e.g., 0) if current is not detected.

After applying the verify voltage 520, the memory device 120 may reduce the voltage on the selected access line to the baseline voltage 525 to complete the 1P1V write operation. In some implementations, the program verify operation 510 is performed to determine whether a threshold quantity of memory cells (e.g., a threshold number or a threshold percentage) have been successfully programmed. The write operation may pass or fail based on whether the threshold quantity of memory cells have been successfully programmed.

In some implementations, the memory device 120 may first raise the voltage on the selected access line from the baseline voltage 525 to a pass voltage 530 that is between the baseline voltage 525 and the program voltage 515. When the memory device 120 determines that the pass voltage 530 has been reached, the memory device 120 may then raise the voltage on the selected access line from the pass voltage 530 to the program voltage 515. In some implementations, the memory device 120 may apply the pass voltage 530 to the selected access line to reduce the likelihood of over-programming memory cells on the selected access line to a data state other than the desired data state (e.g., a data state associated with a higher threshold voltage than the desired data state). Additionally, or alternatively, the memory device 120 may apply the pass voltage 530 to all access lines (e.g., in a block, sub-block, or page of memory to be programmed), including both selected access lines (e.g., connected to memory cells that are to be programmed) and unselected access lines (e.g., connected to memory cells that are not to be programmed), as part of the program operation. For example, the memory device 120 may apply the pass voltage 530 to unselected access lines to reduce program disturbs (e.g., inadvertent programming of memory cells on unselected access lines). In some implementations, the memory device 120 may apply a different pass voltage 530 to selected access lines as compared to unselected access lines.

As further shown in FIG. 5, and by reference number 535, a 1P0V write voltage pattern includes a single program pulse 540 that is not immediately followed by a program verify operation. The program pulse 540 is associated with a program voltage 545.

As further shown in FIG. 5, when a memory device 120 performs a 1P0V write operation using a 1P0V write voltage pattern, the memory device 120 raises the voltage on a selected access line from a baseline voltage 550 to a program voltage 545 during a first time period T1 that corresponds to the program pulse 540, in a similar manner as described above in connection with the 1P1V write operation. However, unlike the 1P1V write operation, the memory device 120 does not perform a program verify operation after applying the single program pulse 540 in the 1P0V write operation.

Because the 1P0V write operation includes fewer program verify operations than the 1P1V write operation, the 1P0V write operation has a faster write time than the 1P1V write operation and consumes less power than the 1P1V write operation. However, because the 1P0V write operation does not include a program verify operation, the 1P0V write operation may be less reliable than the 1P1V write operation. Some techniques described herein enable the use of the 1P0V write operation (or another write operation that is less reliable) by using a mechanism other than a program verify operation to detect potential reliability issues, thereby reducing power consumption and reducing write times while still maintaining reliable operations.

In some implementations, the memory device 120 may first raise the voltage on the selected access line from the baseline voltage 550 to a pass voltage 555, and may then raise the voltage on the selected access line from the pass voltage 555 to the program voltage 545, in a similar manner as described above.

The write voltage patterns shown in FIG. 5 and described above are provided as examples, and other write voltage patterns may be used in connection with the operations described herein. In general, implementations described herein enable a memory device to use a first write voltage pattern that is less reliable than a second write voltage pattern but that has advantages over the second write voltage pattern, such as lower power consumption than the second write voltage pattern and/or faster write times than the second write voltage pattern.

As indicated above, FIG. 5 is provided as an example. Other examples may differ from what is described with regard to FIG. 5.

Figure 6:
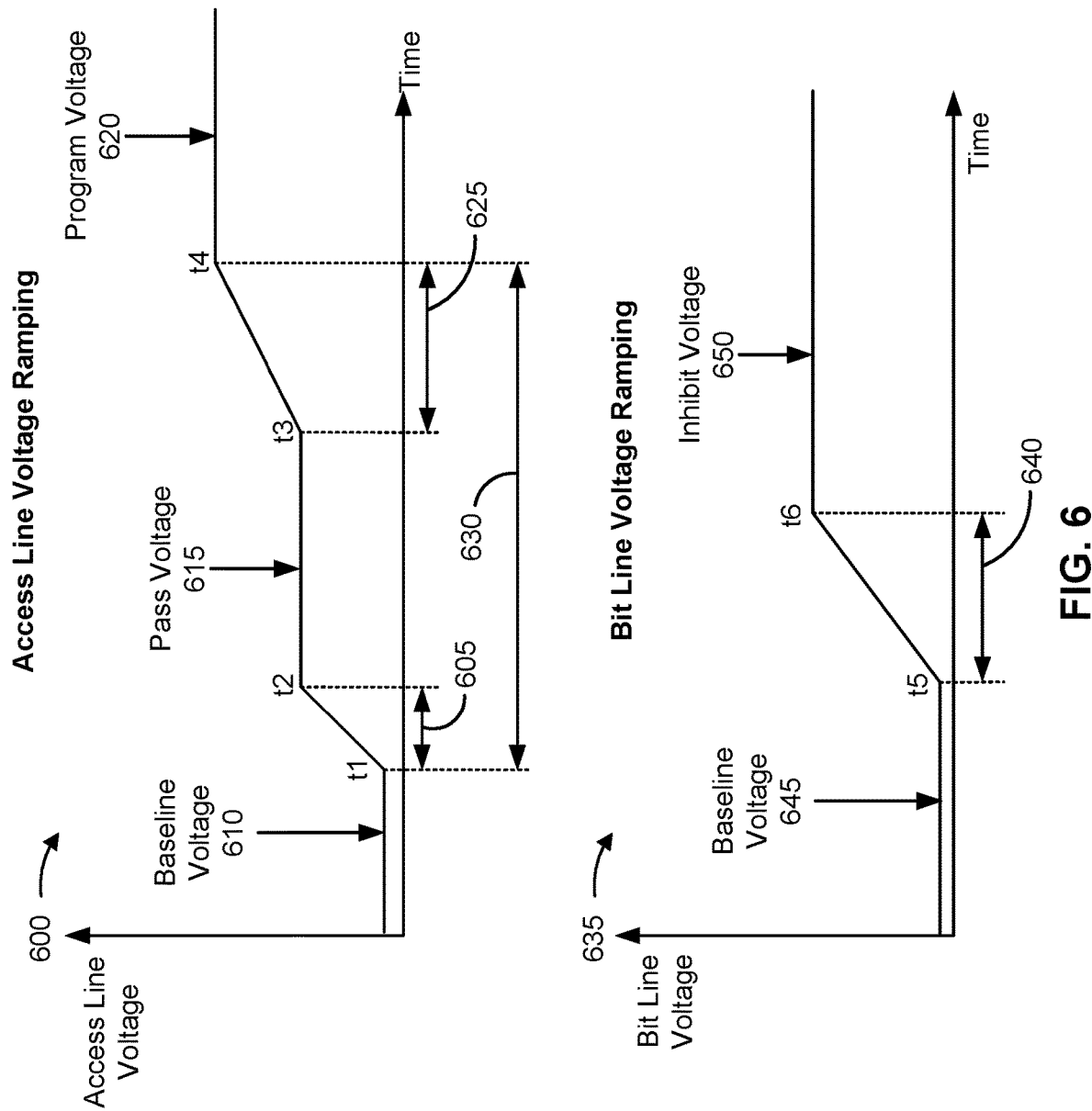
FIG. 6 is a diagram of examples of voltage ramping that may be detected by a memory device in accordance with implementations described herein.

FIG. 6 is a diagram of examples of voltage ramping that may be detected by a memory device in accordance with implementations described herein. The operations described in connection with FIG. 6 may be performed by the memory device 120 and/or one or more components of the memory device 120, such as the controller 130 and/or one or more components of the controller 130.

During a program operation to program data to one or more memory cells (e.g., using the 1P0V write voltage pattern, as described above), a memory device 120 may ramp a voltage on one or more conductive lines of the memory device 120, such as one or more access lines and/or one or more bit lines. "Ramping" a voltage means transitioning from a first voltage to a second voltage, such as by increasing the voltage from the first voltage (e.g., a lower voltage) to a second voltage (e.g., a higher voltage). For example, the memory device may apply a higher voltage than the first voltage to a selected line to cause the voltage on the selected line to increase from the first voltage to a second voltage. Although some examples of ramping are described herein in connection with increasing a voltage on a conductive line, in some implementations, ramping may include decreasing the voltage on a conductive line (e.g., from a first, higher voltage to a second, lower voltage).

The amount of time needed to ramp (or transition) from the first voltage to the second voltage is called a "ramping time" (or a "transition time"). The ramping time to ramp from a first voltage to a second voltage may typically fall within a range of values (e.g., a range of times) under normal operating conditions of the memory device 120. If the ramping time falls outside of the range (e.g., is greater than a threshold value at the upper boundary of the range), then this may be indicative of a problem (e.g., a reliability risk) associated with the memory device 120. Some implementations described herein are capable of detecting the ramping time and using the ramping time to determine whether to perform one or more mitigation operations, such as to verify reliability of the memory device 120 (e.g., by performing a program verify operation that would otherwise not be performed).

As an example, and as shown by reference number 600, the memory device 120 may determine a ramping time associated with one or more access lines. For example, as shown by reference number 605, the memory device 120 may determine a time to ramp from a baseline voltage 610 (at time t1) to a pass voltage 615 (at time t2) during the program operation, as described above in connection with FIG. 5. In some implementations, the memory device 120 may determine a time to ramp from the baseline voltage 610 to the pass voltage 615 on a selected access line connected to one or more memory cells to be programmed, as shown in FIG. 6. Additionally, or alternatively, the memory device 120 may determine a time to ramp from a baseline voltage 610 to a pass voltage 615 on one or more unselected access lines (e.g., where a program voltage 620 is not subsequently applied to the unselected access lines).

Additionally, or alternatively, the memory device 120 may determine a time to ramp from the pass voltage 615 (at time t3) to the program voltage 620 (at time t4) on a selected access line, as shown by reference number 625. Additionally, or alternatively, the memory device 120 may determine a time to ramp from the baseline voltage 610 (at time t1) to the program voltage 620 (at time t4) on a selected access line, which may include a time period during which the pass voltage 615 is applied (e.g., from time t2 to t3), as shown by reference number 630.

In some cases, if a ramping time from the baseline voltage 610 to the pass voltage 615 (e.g., on a selected access line and/or an unselected access line), a ramping time from the pass voltage 615 to the program voltage 620 (e.g., on a selected access line), and/or a ramping time from the baseline voltage 610 to the program voltage 620 (e.g., on a selected access line) is greater than (or equal to) a threshold, then this may indicate a reliability risk associated with the memory device 120, such as electrical shorting between two or more access lines.

As another example, and as shown by reference number 635, the memory device 120 may determine a ramping time associated with one or more bit lines. For example, as shown by reference number 640, the memory device 120 may determine a time to ramp from a baseline voltage 645 (at time t5) to an inhibit voltage 650 (at time t6) during the program operation. In some implementations, the memory device may apply the inhibit voltage 650 to a bit line of a memory cell that is not to be programmed so that when the program voltage 620 is applied to a control gate of that memory cell, the program voltage 620 does not create sufficient voltage differential to draw additional electrons into the floating gate of that memory cell, thus preventing that memory cell from being programmed. Thus, in some implementations, the memory device 120 may determine a time to ramp from the baseline voltage 645 to the inhibit voltage 650 on an unselected bit line connected to one or more memory cells that are not to be programmed.

In some cases, if a ramping time from the baseline voltage 645 to the inhibit voltage 650 (e.g., on an unselected bit line) is greater than (or equal to) a threshold, then this may indicate a reliability risk associated with the memory device 120, such as electrical shorting between two or more bit lines.

Although FIG. 6 shows example ramping times that may be detected by the memory device 120 to determine a reliability risk, the memory device 120 may detect other ramping times not shown in FIG. 6. In general, the memory device 120 may detect a ramping time from a first voltage to a second voltage on a conductive line of the memory device 120, such as an access line, a bit line, or one or more other conductive lines of the memory device 120 (e.g., one or more lines described above in connection with FIG. 3).

As indicated above, FIG. 6 is provided as an example. Other examples may differ from what is described with regard to FIG. 6.

FIG. 7 is a diagram of an example 700 of detecting a memory write reliability risk without using a write verify operation. The operations described in connection with FIG. 7 may be performed by the memory device 120 and/or one or more components of the memory device 120, such as the controller 130 and/or one or more components of the controller 130.

As shown by reference number 710, the controller 130 may perform a program operation without a verification operation. The program operation may be an operation to program data to a memory block (e.g., one or more memory cells of the memory block) of the memory device. For example, the controller 130 may perform a program operation that does not include (e.g., that excludes) a program verify operation (e.g., immediately following a program pulse or immediately following each program pulse). As a more specific example, the controller 130 may perform a program operation that includes a single program pulse that is not immediately followed by a program verify operation, such as the 1P0V write operation (sometimes called a 1P0V program operation) described above in connection with FIG. 5. In some implementations, the controller 130 performs the program operation using a write voltage pattern that does not include any program verify operations, such as the 1P0V write voltage pattern described above.

In some implementations, the controller 130 may perform a verification operation (e.g., a program verify operation) as part of the program operation, but may only perform the verification operation if a ramping time satisfies a ramping time threshold, as described below. Thus, under normal operation (when the ramping time threshold is not satisfied), the controller 130 refrains from performing the verification operation. When the ramping time threshold is satisfied, then the controller 130 may perform the verification operation. As used herein, a program verify operation does not immediately follow a program pulse (or is not immediately after the program pulse) if the controller 130 applies the program pulse, checks whether the ramping time satisfies the ramping time threshold, and then only performs the program verify operation if the ramping time satisfies the ramping time threshold. Thus, in some implementations, the program operation includes a program verify operation only if the ramping time satisfies a ramping time threshold.

As shown by reference number 720, the controller 130 may determine a ramping time associated with performing the program operation, such as one or more ramping times described above in connection with FIG. 6. The ramping time may be a time to ramp from a first voltage to a second voltage on a conductive line of the memory device 120, such as an access line or a bit line, during the program operation. The controller 130 may determine the ramping time as a difference between a first time at which ramping from the first voltage is triggered and a second time at which the second voltage is reached (e.g., at which a voltage applied to the conductive line is greater than or equal to the second voltage). For example, the controller 130 may start a timer at a first time when the transition from the first voltage to the second voltage is triggered (e.g., at a first time at which a transition from the first voltage to the second voltage begins), such as at time t1 in FIG. 6 if the first voltage is an access line baseline voltage, at time t3 in FIG. 6 if the first voltage is an access line pass voltage, or at time t5 in FIG. 6 if the first voltage is a bit line baseline voltage. The controller 130 may stop the timer at a second time when the applied voltage is greater than or equal to the second voltage, such as at time t2 in FIG. 6 if the second voltage is an access line pass voltage, at time t4 in FIG. 6 if the second voltage is an access line program voltage, or at time t6 in FIG. 6 if the second voltage is a bit line inhibit voltage. The ramping time may be the value indicated by the timer.

For example, the controller 130 may determine a ramping time to ramp from a baseline voltage on a selected access line (a "selected access line baseline voltage") to a pass voltage on the selected access line, a ramping time to ramp from a baseline voltage on an unselected access line (an "unselected access line baseline voltage") to a pass voltage on the unselected access line, a ramping time to ramp from a baseline voltage on a selected access line to a program voltage on the selected access line, a ramping time to ramp from a pass voltage on a selected access line to a program voltage on the selected access line, and/or a ramping time to ramp from a baseline voltage on a bit line (a "bit line baseline voltage") to an inhibit voltage on the bit line. Each of these individual ramping times may be called a "ramping time type." For example, a ramping time to ramp from a baseline voltage on a selected access line to a program voltage on the selected access line may be called a first ramping time or a first ramping time type, and a ramping time to ramp from a baseline voltage on a bit line to an inhibit voltage on the bit line may be called a second ramping time or a second ramping time type.

In other words, the first voltage may be a baseline voltage on a selected access line and the second voltage may be a pass voltage on the selected access line. Alternatively, the first voltage may be a baseline voltage on an unselected access line and the second voltage may be a pass voltage on the unselected access line. Alternatively, the first voltage may be a baseline voltage on a selected access line and the second voltage may be a program voltage on the selected access line. Alternatively, the first voltage may be a pass voltage on a selected access line and the second voltage may be a program voltage on the selected access line. Alternatively, the first voltage may be a baseline voltage on a bit line and the second voltage may be an inhibit voltage on the bit line.

As shown by reference number 730, the controller 130 may determine whether the ramping time satisfies (e.g., is greater than or equal to) a ramping time threshold (sometimes called a transition time threshold). In some implementations, the controller 130 may determine a single one of the ramping times described above. For example, the controller 130 may determine only a ramping time to ramp from a pass voltage on a selected access line to a program voltage on the selected access line. In this case, the controller 130 may determine whether the memory device 120 is associated with a reliability risk based on that single ramping time, such as by comparing that single ramping time to a ramping time threshold to determine whether the single ramping time satisfies the ramping time threshold. In some implementations, the single ramping time may be a ramping time to ramp from a first voltage to a second voltage on the selected access line (e.g., from a baseline voltage to a pass voltage, from a pass voltage to a program voltage, or from the baseline voltage to the program voltage) so that the memory device 120 can determine whether there is a reliability risk associated with incorrect programming of the selected access line.

Alternatively, the controller 130 may determine multiple ramping times, such as at least two of the ramping times described above. For example, the controller 130 may determine a first ramping time to ramp from a pass voltage to a program voltage and may determine a second ramping time to ramp from a bit line baseline voltage to a bit line inhibit voltage. In this case, the controller 130 may determine whether the memory device 120 is associated with a reliability risk based on the multiple ramping times, such as by comparing a first ramping time, of the multiple ramping times, to a first ramping time threshold, comparing a second ramping time, of the multiple ramping times, to a second ramping time threshold, and so on. In some implementations, if any of the ramping times satisfies (e.g., if any of the ramping times is greater than) a corresponding ramping time threshold, then the controller 130 may determine that the memory device 120 is associated with a reliability risk, and may perform a verification operation and/or a mitigation operation, as described below.

In some implementations, the controller 130 may determine two ramping times. The first ramping time may be associated with the selected access line to determine whether there is a reliability risk associated with incorrect programming of the selected access line, as described above. The second ramping time may be a ramping time to ramp from a first voltage to a second voltage on an inhibited bit line (e.g., from a baseline voltage to an inhibit voltage) so that the memory device 120 can determine whether there is a reliability risk where programming of the selected access line causes a program disturb to a memory cell that is unsuccessfully inhibited by an inhibit voltage applied to a bit line connected to the memory cell.

In some implementations, if the controller 130 determines multiple ramping times, then the controller 130 may compare each determined ramping time to a corresponding ramping time threshold. In some implementations, ramping times for different pairs of voltages (e.g., different first and second voltages) may be associated with different ramping time thresholds. For example, a first ramping time threshold that is compared to a ramping time to ramp from a pass voltage to a program voltage may be different from a second ramping time threshold that is compared to a ramping time to ramp from a bit line baseline voltage to a bit line inhibit voltage.

In some implementations, a ramping time threshold (e.g., corresponding to a particular pair of voltages) is a static value. For example, the memory device 120 may store (e.g., in memory 140) a static value that indicates the ramping time threshold. In some implementations, the static value does not change over time, such as for different operating temperatures or different numbers of program/erase (P/E) cycles. If the controller 130 determines a single ramping time, then the memory device 120 may store a single ramping time threshold corresponding to that single ramping time. If the controller 130 determines multiple ramping times, then the memory device 120 may store a first ramping time threshold corresponding to a first ramping time, a second ramping time threshold corresponding to a second ramping time, and so on (e.g., may store a ramping time threshold corresponding to each ramping time type determined by the controller 130). Having a single ramping time threshold per ramping time type may reduce complexity and conserve processing resources when determining whether the ramping time satisfies the ramping time threshold.

Alternatively, a ramping time threshold (e.g., corresponding to a particular pair of voltages) may change over time, such as based on a temperature of the memory device 120 and/or a number of P/E cycles associated with a memory block programmed by the program operation. For example, the ramping time threshold may depend on a temperature (e.g., an operating temperature) of the memory device 120 at a time when the program operation is performed and/or a time at which the ramping time is compared to the ramping time threshold. In some implementations, the memory device 120 may store a temperature table with multiple entries. Each entry may indicate a temperature (or a range of temperatures) and a ramping time threshold, for a particular pair of voltages, corresponding to that temperature (or that range of temperatures). The memory device 120 may determine a temperature associated with the memory device 120 (e.g., based on information from a temperature sensor), may identify an entry in the temperature table corresponding to that temperature (e.g., an entry that indicates that temperature or that indicates a range of temperatures that includes that temperature), and may determine a corresponding ramping time threshold indicated in that entry. The memory device 120 may then compare the ramping time to the ramping time threshold determined based on the temperature table. In some cases, a voltage may ramp faster or slower at different temperatures, and this enables the memory device 120 to detect reliability risks more precisely at a variety of operating temperatures.

As another example, the ramping time threshold may depend on a number of P/E cycles associated with a memory block programmed by the program operation. The memory block may be a block that includes the memory cells being programmed by the program operation, a block that includes the selected access line on which the program operation is being performed (e.g., to which an access line voltage is being applied during the program operation), and/or a block that includes a page being programmed by the program operation. In some implementations, the memory device 120 may store a P/E table with multiple entries. Each entry may indicate a number of P/E cycles (or a range of numbers of P/E cycles) and a ramping time threshold, for a particular pair of voltages, corresponding to that number of P/E cycles (or that range of numbers of P/E cycles). The memory device 120 may determine a number of P/E cycles associated with the memory block (e.g., based on information stored by the memory management component 250), may identify an entry in the P/E table corresponding to that number of P/E cycles (e.g., an entry that indicates that number of P/E cycles or that indicates a range of temperatures that includes that number of P/E cycles), and may determine a corresponding ramping time threshold indicated in that entry. The memory device 120 may then compare the ramping time to the ramping time threshold determined based on the P/E table.

In some cases, a voltage may ramp faster or slower at different ages of the memory device 120 (e.g., for different numbers of P/E cycles), and this enables the memory device 120 to detect reliability risks more precisely at a variety of ages of the memory device 120.

Additionally, or alternatively, the ramping time threshold may depend on a physical location of a memory cell, such as a physical location along a conductive line, such as an access line or a bit line. Additionally, or alternatively, the ramping time threshold may depend on a physical location of a conductive line (e.g., relative to a voltage source), such as an access line or a bit line. For example, a memory cell and/or conductive line located farther from a voltage source may be associated with a longer ramping time than a memory cell and/or conductive line located closer to the voltage source. Thus, in some implementations, the memory device 120 may store a location table with multiple entries. Each entry may indicate a conductive line or a group of conductive lines (e.g., a conductive line group, such as an access line group or a bit line group) and a ramping time threshold, for a particular pair of voltages, corresponding to that conductive line or that group of conductive lines. The memory device 120 may determine a selected conductive line, may identify an entry in the location table corresponding to the selected conductive line (e.g., a conductive line group that includes the selected conductive line), and may determine a corresponding ramping time threshold indicated in that entry. The memory device 120 may then compare the ramping time to the ramping time threshold determined based on the location table.

As shown by reference number 740, if the controller 130 determines that the ramping time does not satisfy the ramping time threshold, such as if the ramping time is less than (or equal to) the ramping time threshold, then the program operation passes without a verification operation. In this case, the controller 130 may refrain from performing a verification operation, such as a program verify operation, based on determining that the ramping time is less than (or equal to) the ramping time threshold. Additionally, or alternatively, the controller 130 may determine and/or may indicate that the program operation has passed based on determining that the ramping time is less than (or equal to) the ramping time threshold. The controller 130 may then perform one or more memory operations (e.g., a read operation, a write operation, or an erase operation), such as by executing one or more memory commands (e.g., a next command in a queue) based on determining that the program operation has passed. In this way, the controller 130 may quickly perform write operations and/or may conserve power as compared to performing the verification operation (e.g., a program verify operation) as part of the every program operation.

As shown by reference number 750, if the controller 130 determines that the ramping time satisfies the ramping time threshold, such as if the ramping time is greater than (or equal to) the ramping time threshold, then the controller 130 may perform a verification operation. In some implementations, performing the verification operation includes performing a program verify operation, such as the program verify operation 510 described above in connection with FIG. 5. For example, the controller 130 may perform a program verify operation to determine whether a threshold quantity of memory cells (e.g., a threshold number or a threshold percentage) have been successfully programmed to a desired state (e.g., out of all memory cells to be programmed to the desired state). In some implementations, the controller 130 may perform the program verify operation after a write voltage pattern (e.g., a 1P0V write voltage pattern) has been applied and after determining that the ramping time satisfies the ramping time threshold. If the controller 130 determines that the threshold quantity of memory cells have been programmed to the desired state, then the controller 130 may determine and/or may indicate that the program operation has passed, and may proceed with performing one or more other memory operations, as described above. In some cases, not all memory cells need to be programmed to the desired state because error correction can be performed by the memory device 120 on failed memory cells, such as by using an error correction code (ECC).

In some implementations, if the controller 130 determines that the threshold quantity of memory cells have not been programmed to the desired state, then the controller 130 may increase a program voltage and apply the increased program voltage to the selected access line, such as by using ISPP, as described above in connection with FIG. 4. The controller 130 may apply a program voltage and perform a program verify operation for one or more iterations, such as until a condition is satisfied, as described above in connection with FIG. 4.

Additionally, or alternatively, the controller 130 may perform one or more mitigation operations based on determining that the ramping time is greater than (or equal to) the ramping time threshold. In some implementations, a mitigation operation may include a verification operation, such as the program verify operation described above. Additionally, or alternatively, a mitigation operation may include outputting an alert to another device (e.g., the host device 110) indicating that the program operation has failed and/or that the memory device 120 is associated with a reliability risk. Additionally, or alternatively, a mitigation operation may include triggering a data integrity scan (e.g., for a memory block on which the program operation was performed), increasing a frequency at which the data integrity scan is performed, folding the memory block (e.g., moving data from the memory block to another memory block, such as from an SLC block to an MLC block), and/or abandoning the memory block (e.g., marking the block as invalid and refraining from using the block to store subsequent data).

Thus, the controller 130 may selectively perform the verification operation (e.g., the program verify operation) based on whether the ramping time satisfies a ramping time threshold. As used herein, "selectively performing" the verification operation means to either perform the verification operation or refrain from performing the verification operation. For example, selectively performing the verification operation based on whether the ramping time satisfies a ramping time threshold means that the verification operation is performed if the ramping time satisfies the ramping time threshold and that the verification operation is not performed if the ramping time does not satisfy the ramping time threshold (or vice versa). Thus, "selectively performing" a verification operation may include determining whether to perform the verification operation and then either performing the verification operation or refraining from performing the verification operation based on that determination.

In this way, the memory device 120 may detect a reliability risk associated with a program operation without being required to perform a program verify operation with every write operation, which reduces write times and power consumption while still enabling reliable operations.

In some implementations, the controller 130 may set a flag value to a first value (e.g., "0") based on determining that the ramping time does not satisfy the ramping time threshold, such as if the ramping time is less than (or equal to) the ramping time threshold. Additionally, or alternatively, the controller 130 may set the flag value to a second value (e.g., "1") based on determining that the ramping time satisfies the ramping time threshold, such as if the ramping time is greater than (or equal to) the ramping time threshold. The memory device 120 and/or another device, such as the host device 110, may perform one or more mitigation operations based on the flag value, as described in more detail below in connection with FIG. 8.

As indicated above, FIG. 7 is provided as an example. Other examples may differ from what is described with regard to FIG. 7.

FIG. 8 is a diagram of an example 800 of detecting a memory write reliability risk without using a write verify operation. The operations described in connection with FIG. 8 may be performed by the memory device 120 and/or one or more components of the memory device 120, such as the controller 130 and/or one or more components of the controller 130.

As shown by reference number 810, the controller 130 may perform a program operation without a verification operation, as described above in connection with reference number 710 of FIG. 7. As shown by reference number 820, the controller 130 may determine a ramping time associated with performing the program operation, as described above in connection with reference number 720 of FIG. 7. As shown by reference number 830, the controller 130 may determine whether the ramping time satisfies (e.g., is greater than or equal to) a ramping time threshold, as described above in connection with reference number 730 of FIG. 7.

As shown by reference number 840, if the controller 130 determines that the ramping time does not satisfy the ramping time threshold, such as if the ramping time is less than (or equal to) the ramping time threshold, then the controller 130 may set a flag value to a first value (e.g., "0"). In some implementations, based on the flag value being set to the first value, the controller 130, the memory device 120, and/or the host device 110 may refrain from performing one or more mitigation operations. For example, the controller 130 may indicate that the program operation successfully passed based on the flag value being set to the first value.

As shown by reference number 850, if the controller 130 determines that the ramping time satisfies the ramping time threshold, such as if the ramping time is greater than (or equal to) the ramping time threshold, then the controller 130 may set the flag value to a second value (e.g., "1"). In some implementations, based on the flag value being set to the second value, the controller 130, the memory device 120, and/or the host device 110 may refrain from performing one or more mitigation operations.

For example, the memory device 120 and/or another device, such as the host device 110, may perform one or more mitigation operations based on the flag value. For example, the flag value may be associated with triggering a verification operation (e.g., a program verify operation), and the controller 130 may perform the verification operation, as described above, based on the flag value being set to the second value. Additionally, or alternatively, the controller 130 may output an alert to another device (e.g., the host device 110) based on the flag value being set to the second value. In some implementations, outputting the alert may include indicating the flag value to the other device. The alert and/or the flag value may cause the other device (e.g., the host device 110) to mitigate the reliability risk, such as by transmitting one or more instructions for the memory device 120, such as an instruction to transfer data to a different memory block and/or an instruction to transfer data to a different memory device 120.

Additionally, or alternatively, the controller 130 may trigger a data integrity scan (e.g., for a memory block on which the program operation was performed) based on the flag value being set to the second value. The data integrity scan may include verifying the integrity of stored data (e.g., to verify that the data is not corrupt) and/or performing an error handling operation to correct corrupted data (e.g., identified during the data integrity scan). For example, the data integrity scan may include executing one or more read commands, determining an error rate associated with corresponding data read from the memory 140, and selectively performing one or more error handling operations based on the error rate. Additionally, or alternatively, the controller 130 may increase a frequency at which the data integrity scan is performed (e.g., for a memory block on which the program operation was performed) based on the flag value being set to the second value. For example, if the data integrity scan was previously performed once per day, the controller 130 may store an indication that the data integrity scan is to be performed twice per day.

Additionally, or alternatively, the controller 130 may fold the memory block on which the program operation was performed based on the flag value being set to the second value. Folding a memory block may include transferring data from the memory block to another memory block. In some implementations, the memory block on which the program operation was performed is an SLC block (e.g., that includes only SLC memory cells), and folding the memory block includes transferring data from the SLC block to an MLC block (e.g., that includes only MLC memory cells, such as double-level cells, triple level cells, or quad-level cells).

Additionally, or alternatively, the controller 130 may transfer data from the memory block on which the program operation was performed based on the flag value being set to the second value. As described above, the data may be transferred from an SLC block to an MLC block via folding. Alternatively, the data may be transferred to a same type of block that includes the same type of memory cells, such as from an SLC block to another SLC block. Additionally, or alternatively, the data may be transferred from the memory device 120 to another memory device (e.g., included in a system that includes the memory device 120, such as an SSD).

Additionally, or alternatively, the controller 130 may abandon the memory block based on the flag value being set to the second value. For example, the controller 130 may mark the block as invalid and refrain from using the block to store subsequent data.

Thus, the controller 130 may selectively perform a mitigation operation (or multiple mitigation operations) based on whether the flag value is set to a first value or a second value. As used herein, "selectively performing" a mitigation operation means to either perform the mitigation operation or refrain from performing the mitigation operation. For example, selectively performing the mitigation operation based on whether the flag value is set to a first value or a second value means that the mitigation operation is performed if the flag value is set to the second value and that the mitigation operation is not performed if the flag value is set to the first value (or vice versa). Thus, "selectively performing" a mitigation operation may include determining whether to perform the mitigation operation (e.g., based on the flag value) and then either performing the mitigation operation or refraining from performing the mitigation operation based on that determination.

In this way, the memory device 120 may detect a reliability risk associated with a program operation without being required to perform a program verify operation with every write operation, which reduces write times and power consumption while still enabling reliable operations. Furthermore, the memory device 120 may detect a reliability risk that otherwise would be difficult to detect (e.g., access line to access line shorting or bit line to bit line shorting), and may take an action to mitigate that reliability risk.

As indicated above, FIG. 8 is provided as an example. Other examples may differ from what is described with regard to FIG. 8.

FIG. 9 is a flowchart of an example method 900 associated with detecting a memory write reliability risk without using a write verify operation. In some implementations, a memory device (e.g., memory device 120) may perform or may be configured to perform one or more process blocks of FIG. 9. In some implementations, another device or a group of devices separate from or including the memory device (e.g., the system 100 and/or the host device 110) may perform or may be configured to perform one or more process blocks of FIG. 9. Additionally, or alternatively, one or more components of the memory device (e.g., the controller 130, the memory management component 250, the command execution component 260, the ramping timer component 270, and/or the flag control component 280) may perform or may be configured to perform one or more process blocks of FIG. 9.

As shown in FIG. 9, the method 900 may include determining a ramping time to ramp from a first voltage to a second voltage during a program operation to program data to a memory device, wherein the program operation includes a program pulse that is not immediately followed by a program verify operation (block 910). As further shown in FIG. 9, the method 900 may include determining that the ramping time is greater than or equal to a ramping time threshold (block 920). As further shown in FIG. 9, the method 900 may include performing a verification operation based on determining that the ramping time is greater than or equal to the ramping time threshold (block 930).

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein, such as the operations described in connection with FIGS. 1-8, 10, and/or 11.

FIG. 10 is a flowchart of an example method 1000 associated with detecting a memory write reliability risk without using a write verify operation. In some implementations, a memory device (e.g., memory device 120) may perform or may be configured to perform one or more process blocks of FIG. 10. In some implementations, another device or a group of devices separate from or including the memory device (e.g., the system 100 and/or the host device 110) may perform or may be configured to perform one or more process blocks of FIG. 10. Additionally, or alternatively, one or more components of the memory device (e.g., the controller 130, the memory man-agement component 250, the command execution component 260, the ramping timer component 270, and/or the flag control component 280) may perform or may be configured to perform one or more process blocks of FIG. 10.

As shown in FIG. 10, the method 1000 may include determining a transition time to transition from a first voltage to a second voltage during a program operation performed by an apparatus to program data to memory, wherein the program operation includes a program pulse and only includes a program verify operation if the transition time satisfies the transition time threshold (block 1010). As further shown in FIG. 10, the method 1000 may include comparing the transition time to a transition time threshold (block 1020). As further shown in FIG. 10, the method 1000 may include setting a flag value based on comparing the transition time and the transition time threshold (block 1030). As further shown in FIG. 10, the method 1000 may include selectively performing one or more mitigation operations based on the flag value (block 1040).

Although FIG. 10 shows example blocks of a method 1000, in some implementations, the method 1000 may include additional blocks, fewer blocks, different blocks, or differently arranged blocks than those depicted in FIG. 10. Additionally, or alternatively, two or more of the blocks of the method 1000 may be performed in parallel. The method 1000 is an example of one method that may be performed by one or more devices described herein. These one or more devices may perform or may be configured to perform one or more other methods based on operations described herein, such as the operations described in connection with FIGS. 1-9 and/or 11.

FIG. 11 is a flowchart of an example method 1100 associated with detecting a memory write reliability risk without using a write verify operation. In some implementations, a memory device (e.g., memory device 120) may perform or may be configured to perform one or more process blocks of FIG. 11. In some implementations, another device or a group of devices separate from or including the memory device (e.g., the system 100 and/or the host device 110) may perform or may be configured to perform one or more process blocks of FIG. 11. Additionally, or alternatively, one or more components of the memory device (e.g., the controller 130, the memory management component 250, the command execution component 260, the ramping timer component 270, and/or the flag control component 280) may perform or may be configured to perform one or more process blocks of FIG. 11.

As shown in FIG. 11, the method 1100 may include performing a program operation that includes a single program pulse and that does not include a program verify operation immediately after the single program pulse (block 1110). As further shown in FIG. 11, the method 1100 may include setting a flag value based on comparing a transition time and a transition time threshold, wherein the transition time is a time to transition from a first voltage to a second voltage during the program operation (block 1120). As further shown in FIG. 11, the method 1100 may include selectively performing a mitigation operation based on whether the flag value is set to a first value or a second value (block 1130).

Although FIG. 11 shows example blocks of a method 1100, in some implementations, the method 1100 may include additional blocks, fewer blocks, different blocks, or differently arranged blocks than those depicted in FIG. 11. Additionally, or alternatively, two or more of the blocks of the method 1100 may be performed in parallel. The method 1100 is an example of one method that may be performed by one or more devices described herein. These one or more devices may perform or may be configured to perform one or more other methods based on operations described herein, such as the operations described in connection with FIGS. 1-10.

Figure 12:
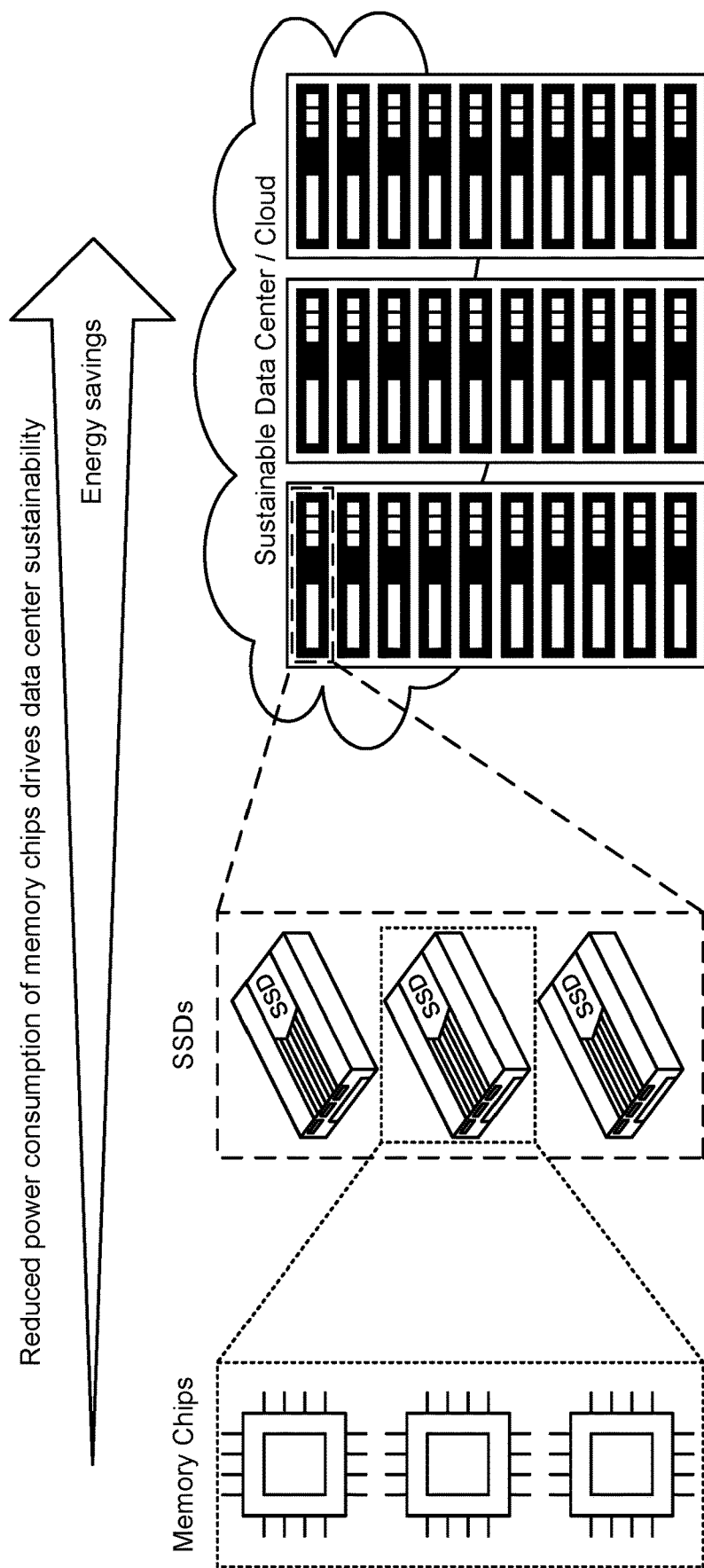
FIG. 12 is a diagram illustrating example systems in which the memory device described herein may be used.

FIG. 12 is a diagram illustrating example systems in which the memory device 120 described herein may be used. In some implementations, one or more memory devices 120 may be included in a memory chip. Multiple memory chips may be packaged together and included in a higher level system, such as a solid state drive (SSD) or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 12, this reduced power consumption drives data center sustainability and leads to energy savings because of the large volume of memory devices 120 included in a data center.

As indicated above, FIG. 12 is provided as an example. Other examples may differ from what is described with regard to FIG. 12.

In some implementations, a memory device includes one or more components configured to: determine a ramping time to ramp from a first voltage to a second voltage during a program operation to program data to the memory device, wherein the program operation includes a program pulse that is not immediately followed by a program verify operation; determine that the ramping time is greater than or equal to a ramping time threshold; and perform a verification operation based on determining that the ramping time is greater than or equal to the ramping time threshold.

In some implementations, an apparatus includes means for determining a transition time to transition from a first voltage to a second voltage during a program operation performed by the apparatus to program data to memory, wherein the program operation includes a program pulse and only includes a program verify operation if the transition time satisfies the transition time threshold; means for comparing the transition time to a transition time threshold; means for setting a flag value based on comparing the transition time and the transition time threshold; and means for selectively performing one or more mitigation operations based on the flag value.

In some implementations, a method includes performing, by a memory device, a program operation that includes a single program pulse and that does not include a program verify operation immediately after the single program pulse; setting, by the memory device, a flag value based on comparing a transition time and a transition time threshold, wherein the transition time is a time to transition from a first voltage to a second voltage during the program operation; and selectively performing, by the memory device, a mitigation operation based on whether the flag value is set to a first value or a second value.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
   determine a ramping time to ramp from a first voltage to a second voltage during a program operation to program data to the memory device,
   wherein the program operation includes a program pulse that is not immediately followed by a program verify operation;
   determine that the ramping time is greater than or equal to a ramping time threshold; and
   perform a verification operation based on determining that the ramping time is greater than or equal to the ramping time threshold.

2. The memory device of claim 1, wherein the first voltage is a pass voltage and the second voltage is a program voltage.

3. The memory device of claim 1, wherein the first voltage is a bit line baseline voltage and the second voltage is a bit line inhibit voltage.

4. The memory device of claim 1, wherein the one or more components, to determine the ramping time, are configured to determine the ramping time as a difference between a first time at which ramping from the first voltage is triggered and a second time at which the second voltage is reached.

5. The memory device of claim 1, wherein the one or more components are further configured to:
   set a flag value associated with triggering the verification operation based on determining that the ramping time is greater than or equal to the ramping time threshold; and
   wherein the one or more components, to perform the verification operation, are configured to:
   perform the verification operation based on the flag value.

6. The memory device of claim 1, wherein the one or more components are further configured to:
   output an alert to another device based on determining that the ramping time is greater than or equal to the ramping time threshold.

7. The memory device of claim 1, wherein the ramping time threshold is a static value stored in memory of the memory device.

8. The memory device of claim 1, wherein the ramping time threshold is based on a temperature of the memory device.

9. The memory device of claim 1, wherein the ramping time threshold is based on an access line or a bit line on which ramping from the first voltage to the second voltage occurs.

10. An apparatus, comprising:
    means for determining a transition time to transition from a first voltage to a second voltage during a program operation performed by the apparatus to program data to memory,
    wherein the program operation includes a program pulse and only includes a program verify operation if the transition time satisfies a transition time threshold;
    means for comparing the transition time to the transition time threshold;
    means for setting a flag value based on comparing the transition time and the transition time threshold; and
    means for selectively performing one or more mitigation operations based on the flag value.

11. The apparatus of claim 10, wherein the first voltage is a pass voltage and the second voltage is a program voltage.

12. The apparatus of claim 10, wherein the first voltage is a bit line baseline voltage and the second voltage is a bit line inhibit voltage.

13. The apparatus of claim 10, wherein the means for setting the flag value comprises means for setting the flag value to a first value based on determining that the transition time is less than or equal to the transition time threshold; and
    wherein the means for selectively performing the one or more mitigation operations comprises means for indicating that the program operation successfully passed based on the flag value being set to the first value.

14. The apparatus of claim 10, wherein the means for setting the flag value comprises means for setting the flag value to a second value based on determining that the transition time is greater than or equal to the transition time threshold; and
    wherein the means for selectively performing the one or more mitigation operations comprises means for performing the program verify operation based on the flag value being set to the second value.

15. The apparatus of claim 10, wherein the means for selectively performing the one or more mitigation operations comprises means for triggering a data integrity scan associated with a memory block on which the program operation was performed.

16. The apparatus of claim 10, wherein the means for selectively performing the one or more mitigation operations comprises means for increasing a frequency at which a data integrity scan, associated with a memory block on which the program operation was performed, is performed.

17. The apparatus of claim 10, wherein the means for selectively performing the one or more mitigation operations comprises means for folding or abandoning a memory block on which the program operation was performed.

18. The apparatus of claim 10, wherein the transition time threshold is based on a temperature associated with the apparatus, a number of program/erase cycles associated with a memory block on which the program operation was performed, or a conductive line on which the second voltage is applied.

19. A method, comprising:
performing, by a memory device, a program operation that includes a single program pulse and that does not include a program verify operation immediately after the single program pulse;
setting, by the memory device, a flag value based on comparing a transition time and a transition time threshold,
wherein the transition time is a time to transition from a first voltage to a second voltage during the program operation; and
selectively performing, by the memory device, a mitigation operation based on whether the flag value is set to a first value or a second value.

20. The method of claim 19, wherein selectively performing the mitigation operation comprises performing the program verify operation based on the flag value being set to the second value.

21. The method of claim 19, wherein selectively performing the mitigation operation comprises refraining from performing the program verify operation based on the flag value being set to the first value.

22. The method of claim 19, wherein the first voltage is a pass voltage and the second voltage is a program voltage,
wherein the first voltage is an access line baseline voltage and the second voltage is the pass voltage,
wherein the first voltage is the access line baseline voltage and the second voltage is the program voltage, or
wherein the first voltage is a bit line baseline voltage and the second voltage is a bit line inhibit voltage.

23. The method of claim 19, further comprising determining the transition time based on a first time at which a transition from the first voltage to the second voltage begins and a second time at which the second voltage is reached.

24. The method of claim 19, wherein the transition time threshold is based on a temperature of the memory device or a number of program/erase cycles associated with a memory block of the memory device.

25. The method of claim 19, further comprising indicating the flag value to a system to cause the system to perform one or more mitigation operations associated with a memory block on which the program operation was performed.

* * * * *